United States Patent [19]

Hosten

[11] Patent Number: 4,755,271
[45] Date of Patent: Jul. 5, 1988

[54] ELECTROPLATING APPARATUS FOR PLATE-SHAPED WORKPIECES, PARTICULARLY PRINTED CIRCUIT BOARDS

[75] Inventor: Daniel Hosten, Handzeme, Belgium

[73] Assignee: Siemens Aktiengesellschaft, Berlin and Munich, Fed. Rep. of Germany

[21] Appl. No.: 56,247

[22] Filed: Jun. 1, 1987

[30] Foreign Application Priority Data

Jul. 28, 1986 [DE] Fed. Rep. of Germany ....... 3625483

[51] Int. Cl.⁴ ............................................ C25D 17/00
[52] U.S. Cl. ...................... 204/198; 204/202
[58] Field of Search ........... 204/198, 202, 203

[56] References Cited

U.S. PATENT DOCUMENTS

| | | | |
|---|---|---|---|
| 2,074,220 | 3/1937 | Holland | 204/223 |
| 2,074,221 | 3/1937 | Holland | 204/129.7 |
| 4,385,967 | 5/1983 | Brady | 204/198 |
| 4,402,799 | 9/1983 | Ash | 204/202 |
| 4,402,800 | 9/1983 | Ash | 204/202 |

FOREIGN PATENT DOCUMENTS

3236545 5/1983 Fed. Rep. of Germany ...... 204/198
3011061 12/1983 Fed. Rep. of Germany ...... 204/198

*Primary Examiner*—T. M. Tufariello
*Attorney, Agent, or Firm*—Hill, Van Santen, Steadman & Simpson

[57] ABSTRACT

An apparatus for electroplating plate-shaped workpieces, such as a printed circuit board, having a cell, an arrangement for conducting the workpiece through the cell, and anodes arranged in the cell in contact with the electrolyte solution characterized by an arrangement to cathodically connect the workpiece including at least one tong-shaped contact clamp for gripping the workpiece and arrangement for moving the clamp along with the workpiece, as is conveyed through the cell. Preferably, the arrangement for moving is an endless drive of a continuous member, such as a chain or a plurality of belts, and a plurality of contact clamps are spaced along this member to grip the edge portion of the workpieces.

21 Claims, 4 Drawing Sheets

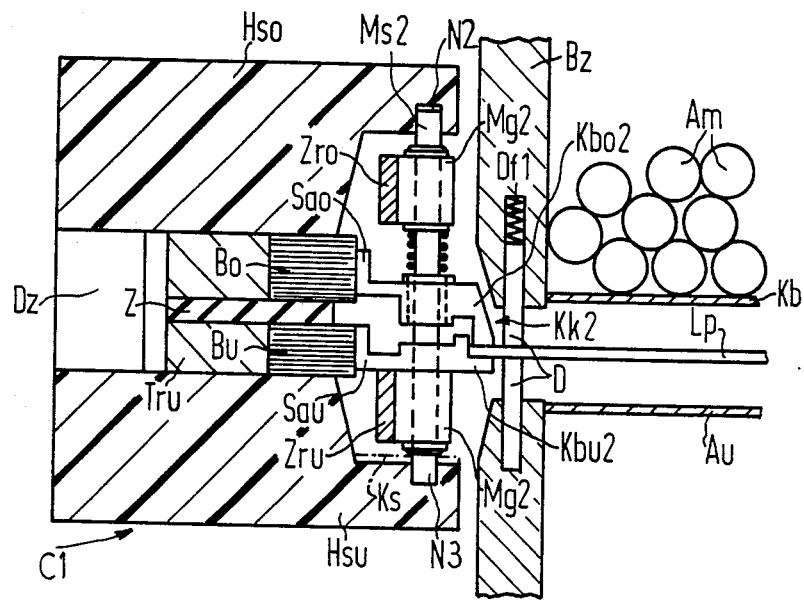
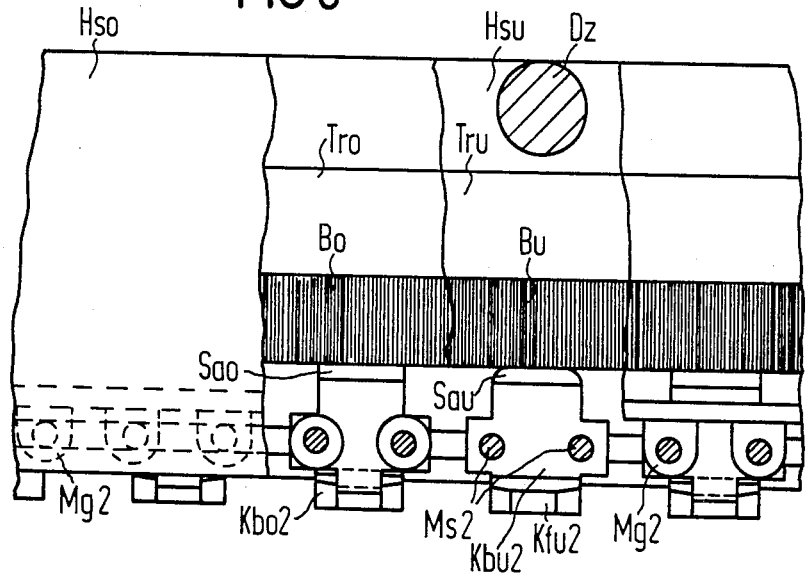

ELECTROPLATING APPARATUS FOR PLATE-SHAPED WORKPIECES, PARTICULARLY PRINTED CIRCUIT BOARDS

BACKGROUND OF THE INVENTION

The present invention is directed to an electroplating apparatus for the electroplating of plate-shaped workpieces, particularly printed circuit boards, which are treated while moving in a horizontal plane. The apparatus includes at least one electroplating cell containing an electrolyte solution, at least one anode arranged in the electrolyte solution in the cell and at least one laterally arranged contacting mechanism for cathodic contacting of the moving workpiece.

German No. A 32 36 545 discloses an electroplating apparatus which has at least one anode arranged in an electrolyte solution in the cell and has at least one laterally arranged contacting mechanism for cathodic contacting of a passing workpiece. Given the apparatus disclosed in this German reference, the plate-shaped workpieces are conducted through the electrolyte solution in a horizontal plane. The feed of the workpiece is encouraged via driven contact wheels which are arranged on one side in the treatment cell and simultaneously serve as contacting mechanisms for cathodic contacting of the workpiece. In order to protect the contact wheels from the electrolyte solution, shielding extends in the direction of movement through this cell and comprises sealing strips pressing against the respective workpieces. A special glide fastening for guidance and support of the workpiece is arranged at that side of the treatment cell which lies opposite the contact wheels.

In the above-mentioned electroplating apparatus, even the employment of seals cannot completely prevent the access of the electrolyte solution to the lateral contacting region of the workpiece and to the contact wheels. As a consequence of these incomplete seals, spongy metal depositions will occur in the contact region, a rapid deterioration of the roll contacts will occur and an unfavorable distribution of the layer thickness of the electro-deposited metal layers, which distribution is too great a variation in the layer thicknesses, will occur.

SUMMARY OF THE INVENTION

The object of the present invention is to improve the cathodic contacting of a workpiece in an electroplating apparatus.

This object is achieved in that the contacting mechanism is formed by tong-shaped contact clamps and includes means for moving the clamps together with the workpiece through the electroplating apparatus.

The invention is based on the perception that the roll contacts, as well as wiper contacts, are particularly sensitive contacts to an electrolyte solution and that a clamp contact presents far fewer difficulties in this regard. In order to be able to realize a clamp contacting of the workpiece with tong-shaped contact clamps, these contact clamps, however, must then be synchronizely moved together with the respective traversing workpiece. Despite the required movability of the contact clamps, the feed of the contact current to the contact clamps presents no problem since the corresponding contacting can now be displaced into a region protected against the access of the electrolyte solution and other negative influences.

Another improvement in the contacting of the transversing workpieces can be achieved in that the plurality of contact clamps are movable laterally together with the workpiece and are provided at a given distance from one another. In addition to contacting at a plurality of locations, particularly given printed circuit boards having a relatively thin lamination, this additional arrangement leads to a considerable improvement of the layer thickness distribution. Accordingly, it is then also particularly beneficial when contact clamps movable together with the workpiece are provided at both sides of the through-put path.

It has proved in accordance with the particularly preferred embodiment of the invention that at least one endless drive is arranged on at least one side of the through-put path as a movable carrier for the tong-shaped contact clamps. Such an endless drive, which is particularly well suited for the accommodation of the electroplating apparatus because of its low space requirement, guarantees the required mobility of the tong-shaped contact clamps in an extremely simple way.

A chain can be employed as the endless drive. In view of the corrosion resistance and flexibility, however, considerable advantages also occur when the endless drive is formed by at least one toothed belt. In this case, it is then possible that the upper clamp jaws of the contact clamps have an upper tooth belt allocated to them and that the lower clamp jaws of the contact clamps have a lower tooth belt associated with them. Such a division into upper and lower toothed belts offers advantages, particularly given the feed of the cathode current to the clamp jaws, since the space between the toothed belts can be utilized for the contacting.

In accordance with another particularly preferred embodiment of the invention, the endless drive is drivable and, together with the tong-shaped contact clamps as dogs, form a conveyor means for the horizontal passage of the workpiece. A particularly simple structure of the overall electroplating apparatus occurs on the basis of such a combination of the contacting mechanism and the convey means for the workpiece.

Another significant advantage of the employment of an endless drive is that at least one cleaning means for a mechanical and/or chemical cleaning of the contact surfaces of the contact clamps can be arranged in the region of the returning side of the endless drive. Metal potentially deposited on the contact surfaces of the contact clamps can then be removed with the assistance of such cleaning device which, for example, can utilize brushes, grindstones, etchant baths or spray nozzles for etching solutions. The contact surfaces which are cleaned in this way on each revolution of the endless drive, guarantees an extremely high reliability for the contacting process.

It is also proven expedient when the cathode current is suppliable to the contact clamps by means of wiper contacts. In this case, the wiper contacting can be considered an extremely reliable contacting, since it cannot be deteriorated by the access of the electrolyte solution at the location provided for the wiper contacts.

When the cathode current of the upperside and of the underside of the workpiece can be separately supplied, for example, by separate rectifiers, then, the layer thickness of the electro-deposition of metal on the upperside and underside of the workpiece can be separately influenced.

When the cathode current is separately suppliable to both sides of the workpiece, then, particularly given printed circuit boards having laminations thinner than 10 μm, even more uniform layer thickness distributions are provided over the printed circuit board can be achieved.

As seen in the through-put direction of the workpiece, the cathode current can also be supplied via at least two separate length portions. As a result of this measure, for example, low current densities can then be selected in the admission region of the printed circuit board, whereby burning of the copper layers deposited in the currentless fashion can be reliably suppressed.

A separate influencing of the metal deposition on the upperside and underside of the workpiece can be realized in a simple way in that the cathode current is suppliable to the upper clamp jaw of the contact clamps via an upper live or contact rail and is suppliable to the lower clamp jaws of the contact clamps by a lower live or contact rail. The upper contact rail and the lower contact rail can be expediently arranged so that they simultaneously serve as connecting members for closing the contact clamps in the electroplating region.

In accordance with the preferred modification of the contacting concept, it is provided that the cathode current is suppliable to the upper jaw of the contact clamps by an upper brush extending in the through-put direction and is suppliable to lower clamp jaws of the contact clamps via a lower brush extending also in the through-put direction. Such brushes guarantee an extremely reliable contacting. Moreover, a direct contacting of the clamp jaws can then be achieved in that the upper brush has current collectors applied to the backside or end of the upper clamp jaws allocated to it and in that the lower brush has current collectors applied to the backside or end of the lower clamp jaws allocated to it.

Another advantageous development of the invention provides that the contacting pressure of the contact clamps can be exerted by a closing spring and that link motions acting in the admission and discharge region of the workpiece are provided for opening the contact clamp. The advantage of this embodiment lies in that especially uniform contacting pressures can be provided. The opening can then be realized in a simple way in that the link motion has an opening bolt of the contact post acting against the force of the contacting spring allocated to it.

Finally, it is especially beneficial in view of the undesired metal deposition in the contact region when the contact clamps are shielded against the access of electrolyte solution by a seal extending laterally in the through-put direction and pressing against the respective workpiece.

Other advantages and features of the invention will be readily apparent from the following description of the preferred embodiments, the claims and drawings.

BRIEF DESCRIPTION OF THE DRAWINGS

FIG. 5 is a cross sectional view with portions in elevation for purpose of illustration of a second embodiment of contacting mechanism utilizing upper and lower toothed belts for conveying the contact clamps;

FIG. 6 is a plan view with different portions broken away to show different levels of the embodiment of FIG. 5.

DESCRIPTION OF THE PREFERRED
EMBODIMENTS

The principals of the present invention are particularly useful when incorporated in a horizontal through-put system, generally indicated at S, which system is utilized for through-contacting and electroplating of printed circuit boards Lp, and is constructed in a modular fashion. The printed circuit boards Lp are inputed into the system S at an emission station Ef and then are transferred successively through modules M1–M5 and then are discharged or depart from the system S in a direction of arrow Tf1 via a discharge station Af.

Figure 1:
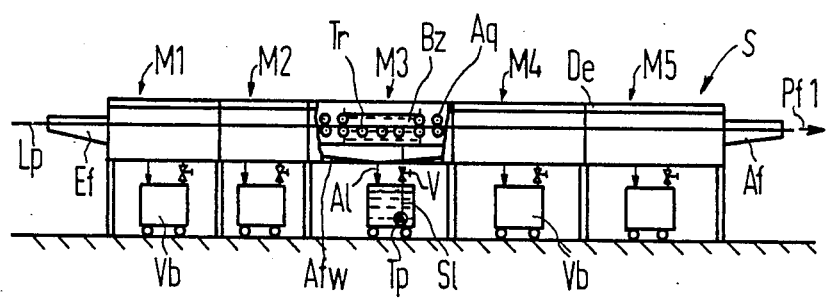
FIG. 1 is a schematic presentation of a horizontal through-put system for through-contacting and electroplating of printed circuit boards.

The overall through-put system S is composed of three types of basic modules. Only some of the modules actually utilized in practice are shown in FIG. 1, by modules M1–M5. Each of the modules M1–M5 is composed of a collecting tank Afw, which receives a treatment cell Bz that has a conveying system for conveying a printed circuit board Lp in a horizontal plane therethrough. In addition, each of the modules is provided with a supply reservoir Vb for the treatment fluid used in the particular cell.

Every collecting tank Afw is arranged on a basic frame G and is provided with a cover De. Inside of the tank Afw is a treatment cell Bz, which has a conveyor formed by conveyor rollers Tr and includes a squeegee roller Aq at the emission side of the cell, as well as at the discharge side of the cell. The treatment fluid collected in the collecting tank Afw is returned into a supply reservoir Vb arranged therebelow by an out-flow or discharge conduit A1. The treatment fluid is pumped into the treatment cell Bz from the reservoir Vb by a pump Tp, which is submerged in the fluid in the reservoir and has a feed conduit S1. As illustrated, each of the reservoirs Vb is mounted on rollers and is movable and the feed conduit S1 has a valve V so that the desired flow rate of the fluid being pumped into the cell can be controlled.

As already mentioned, the through-put system S is composed of three types of basic modules. The spray modules have the job of preventing the entrainment of treatment fluids into the following baths or modules. To this end, a spray connection is arranged in the collecting tank above and below the through-put path. The quantity of spray agents of the upper and the lower jet systems are thereby separately controlled via valves. The above-mentioned squeegee rollers Aq, which are arranged in pairs at the input side and output side, prevent the mixing of the rinsing means and the treatment fluids. Further details regarding such spray modules can be seen from German Pat. No. 30 11 061.

To be cited as a second type of basic module are the chemical treatment modules which, for example, are utilized for the currentless copper plating of the circuit board surface and in the currentless copper plating of the through-contact holes. A flood register thereby guarantees a uniform contacting through all the through-contact holes and a uniform flow against the overall circuit board surface.

Figure 2:
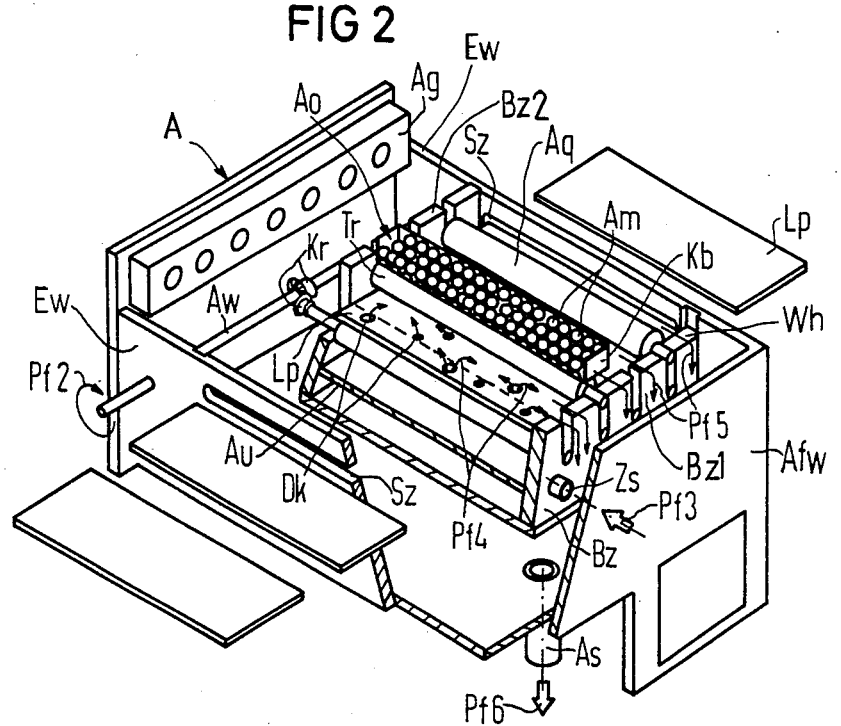
FIG. 2 is a perspective view illustrating an electroplating apparatus of the horizontal through-put system of FIG. 1.

Finally, a third type of basic modules are the electroplating modules generally indicated at A in FIG. 2 and discussed in greater detail hereinbelow. The apparatus A includes a collecting tank Afw which has two end walls Ew which contain slots Sz at the height of the through-put path, which enable the passage of a printed circuit board Lp therethrough. The interior space between the cover De (see FIG. 1) and the collecting tank Afw is provided with a suction removal manifold Ag on one side which is connected to a central extraction or suction apparatus for producing a vacuum or suction in the space above the liquid in the cell. A drive shaft Aw, which is rotated in the direction of the arrow Pf2, is arranged to extend in a longitudinal direction and is positioned below the suction removal manifold Ag and outside of a lateral cell wall Bz2. This drive shaft Aw drives the conveyor rollers Tr and the lower squeegee roller Ag by correspondingly arranged conical gear pairs Kr.

The treatment cell Bz receives an electrolyte solution, which is pumped out of the supply reservoir Vb via a conduit to a feed connector Zs, which discharges laterally through a cell wall Bz1 into the cell, as indicated by the arrow Pf3. The feed of the electrolyte solution is dimensioned so that an upward directed flow indicated by the arrows Pf4 occurs through the through-contacting holes Dk, which are provided in the printed circuit board Lp. Insofar as other preconditions are met, a quantitatively high grade voltaic reinforcement of the through-contacting is guaranteed by this pronounced flow. The electrolyte solution then flows through an upper anode Ao and part will flow in the direction of arrows Pf5 over a lateral weir Wh in the lateral wall Bz1 of the cell Bz and into the collecting tank Afw. The collecting tank Afw is provided with a drain connector As, which is connected to the discharge conduit A1 for returning the electrolyte solution back to the supply reservoir Vb, as indicated by the arrow Pf6.

The above-mentioned upper electrode Ao is arranged at a slight distance above the horizontal through-put path of a printed circuit board Lp and is aligned to extend across the path and parallel to the plane of the horizontal path. The electrode Ao is composed of a basket Kb and of anode material Am arranged therein in one layer or in a plurality of layers. The basket Kb is composed of titanium, with the floor being fashioned as a rib mesh metal which is easily transmissive of the electrolyte solution. In the present case, the anode material Am involves copper balls which are frequently also referred to as copper pellets. It can be seen without further ado that such copper balls can be easily replaced or replenished after the cover De has been removed from the apparatus A.

A lower anode Au is likewise horizontally aligned with the horizontal path at a slight distance under the path of the printed circuit board Lp. This lower anode Au is fashioned as a rib mesh sieve and is composed of a platinum-plated titanium. In contrast to the upper anode Ao, the lower anode Au is an insoluble anode, whose spacing from the through-put path of the printed circuit boards Lp remains constant. The formation thereof as a rib mesh metal sieve allows the electrolyte exchange and the flow of the electrolyte solution from being impeded.

The apparatus includes means for cathodically contacting the printed circuit board, which is of decisive significance to obtain the desired results. Two different embodiments are illustrated, with the means generally indicated at C in FIGS. 3 and 4 being a first embodiment for the cathodic contact, wherein the means generally indicated at C1 in FIGS. 5, 6 and 7 being the second embodiment.

Figure 3:
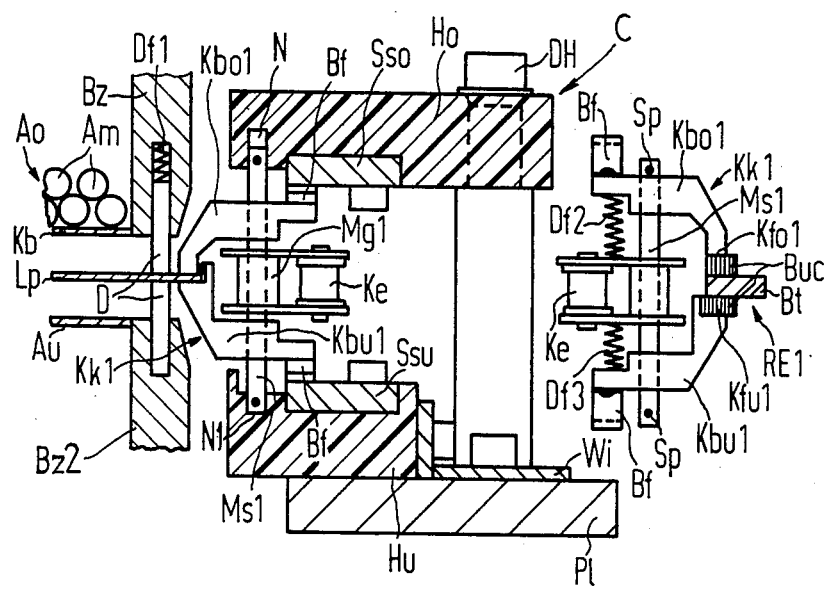
FIG. 3 is a cross sectional view with portions in elevation for purpose of illustration of a first embodiment of a contacting mechanism comprising contact clamps arranged on a chain in accordance with the present invention.

The means C of FIG. 3 is illustrated adjacent a lateral wall, such as the wall Bz2. As illustrated in FIG. 3, a portion of the upper anode Ao together with the basket Kb and the anode material Am, a portion of the printed circuit board Lp to be electroplated and a lower anode Au are seen in the left hand side of the Figure. The printed circuit board Lp has its lateral edge region extending through the wall Bz2 of the treatment cell Bz and the opening required for this purpose, which extends slot-shaped in the through-put direction, is closed by a pair of seals D. A lower seal D is received in a groove in the lower portion of the lateral wall Bz2. The upper seal D is received in a groove and is urged into contact with the upper surface of the printed circuit board Lp by a pressure spring Df1. The sealing strips of the seal D are composed of, for example, a polytetrafluoroethylene and has the job of molding itself against the surface of the passing printed circuit board Lp and of at least largely preventing the exit of the electrolyte solution from the cell.

As illustrated, the edge of the board Lp projects laterally beyond the pair of seals D and is siezed by a plurality of contact clamps Kk1 of the means C for contacting. Each of the contact clamps is arranged at a distance from one another and is constructed in a tong-like manner. Each of these clamps Kk1 is composed of an upper clamp jaw Kbo1 and of a lower clamp jaw Kbu1 and both jaws are displaceably arranged on a vertically aligned pin Ms1. The pin Ms1 is a dog pin and extends through a dog member Mg1 of a chain Ke of a chain drive. The pins Ms1 of the individual contact clamps Kk1 are also additionally guided in U-shaped channel N of an upper retaining rail Ho and in the channel N1 in the lower retaining rail Hu. This longitudinal guidance, however, is limited to the region in which the printed circuit board Lp are to be cathodically contacted and in which the chain drive, together with the contact clamps Kk1 simultaneously fill the job of a conveyor means for the horizontal passage of the printed circuit boards Lp. This guidance is omitted in the deflecting range or at the end of each of the chain drives and in the region of the return side, as illustrated in the right hand side of FIG. 3. The lower retaining rail Hu is connected to an angle Wi and to a plate P1 to form a rigid unit which is, in turn, rigidly connected to the upper retaining rail Ho via a plurality of spacers and retaining pins DH.

On its underside, the upper retaining rail Ho carries an upper sliding live or contact rail Sso. In a similar manner, the lower retaining rail Hu carries a lower live or contact rail Ssu on its upper surface. The two rails Sso and Ssu are composed, for example, of graphite or copper, whereas the two retaining rails Ho and Hu are composed of a high molecular polyethylene.

Each of the upper and lower clamp jaws Kbo1 and Kbu1, on a back part, carry leaf springs Bf, which are guided on the upper live rail Sso or, respectively, the lower rail Ssu. The distance between the upper live rail Sso and the lower live rail Ssu is, thus, dimensioned so that the leaf springs Bf are compressed and exert the contacting pressure to be exerted on the printed circuit board Lp via the upper clamp jaw Kbo1 and the lower clamp jaw Kbu1. The live rails Sso and Ssu are connected to separate rectifiers so that the current density on the upper surface provided by the jaw Kbo1 is different than the current density on the lower surface provided by the jaw Kbu1. Thus, the current densities on the upper surface and lower surface of the printed circuit board Lp can be varied as desired. The live rails Sso and Ssu can also be subdivided in the longitudinal direction so that different rectifiers act on different portions of the travel of the jaws Kbo1 and Kbu1. Thus, the admission region of the printed circuit board Lp can be operating on a lower current density to avoid burning of the previously applied coating, then an increased current density can be applied to the printed circuit board in the middle of the cell.

After the clamp Kk1 has traveled the length of the chain belt, and is passed around the drive pulley, such as KR (FIG. 4), the return side of the chain drive will allow the jaw to be in an open configuration. As illustrated, the leaf springs Bf are no longer stressed. In addition, two compression springs, such as Df2 and Df3, may be provided to open the contacts Kk1 as soon as the leaf springs Bf no longer press against the live rails Sso and Ssu. The cotter pins Sp are provided on the ends of the dog pins Ms1 to limit the opening stroke of the jaws Kbo1 and Kbu1.

During the return of the open contact clamps Kk1, the surfaces Kfo1 and Kfu1 of the two jaws can be cleaned of any undesired metal deposition, copper sludge and, under given conditions, other contaminants which may deteriorate or effect the contact surface. To this end, as shown in FIG. 3, a mechanical cleaning means RE1 comprising a brush carrier Bt and two brushes Buc is shown in a purely schematic fashion interposed between the two contact surfaces Kfo1 and Kfu1. An employment of a grinding stone to be resiliently pressed against the contact surfaces Kfo1 and Kfu1 is also possible. The contact clamps Kk1 are composed of titanium, and those surfaces which are not used in forming the contact are preferably coated with a polytetrafluoroethylene in order to protect them against undesired metal deposits.

Figure 4:
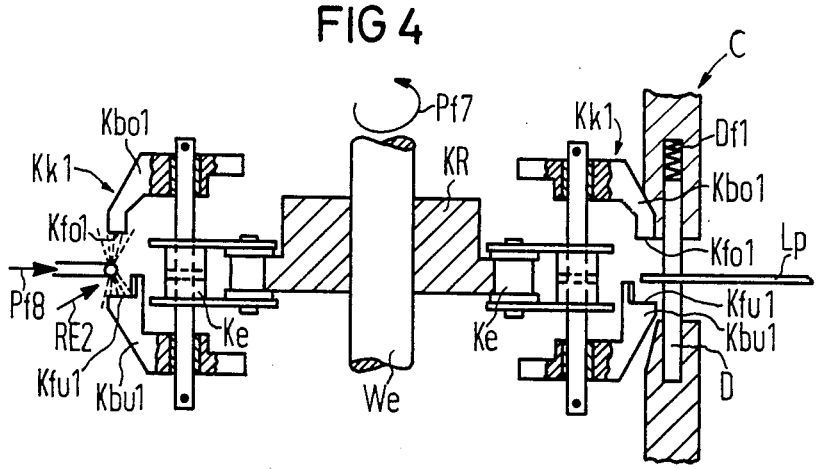
FIG. 4 is a cross sectional view with portions in elevation of the drive for the chain of FIG. 3 showing a modification of that embodiment.

As mentioned hereinabove, once the contacts Kk1 have reached the end of the run next to a wall of the cell Bz, the clamps are released and opened, as illustrated in FIG. 4 on the right hand side. This is adjacent a chain drive wheel KR, which is rotated in the direction Pf7 by a shaft We. Additionally, the arrangement of the contacting mechanism is symmetrical relative to the path of the printed circuit boards through the cell.

A modification of the cleaning of the contact surfaces, such as Kfo1 and Kfu1, is illustrated on the left hand side of FIG. 4, wherein a chemical cleaning is performed. To this end, cleaning means RE2 sprays an etching solution onto the contact surfaces Kfo1 and Kfu1, and this etching solution is supplied in the direction of the arrows Pf8. The etching solution can then be collected via an additional tank arranged within the electroplating apparatus and can be resupplied to the cleaning means RE2. The arrangement of the corresponding etching bath is, likewise, possible. To this end, the endless drive can be correspondingly deflected in the region of the return run in order to achieve a partial submergence of the surfaces to be cleaned.

Figure 7:
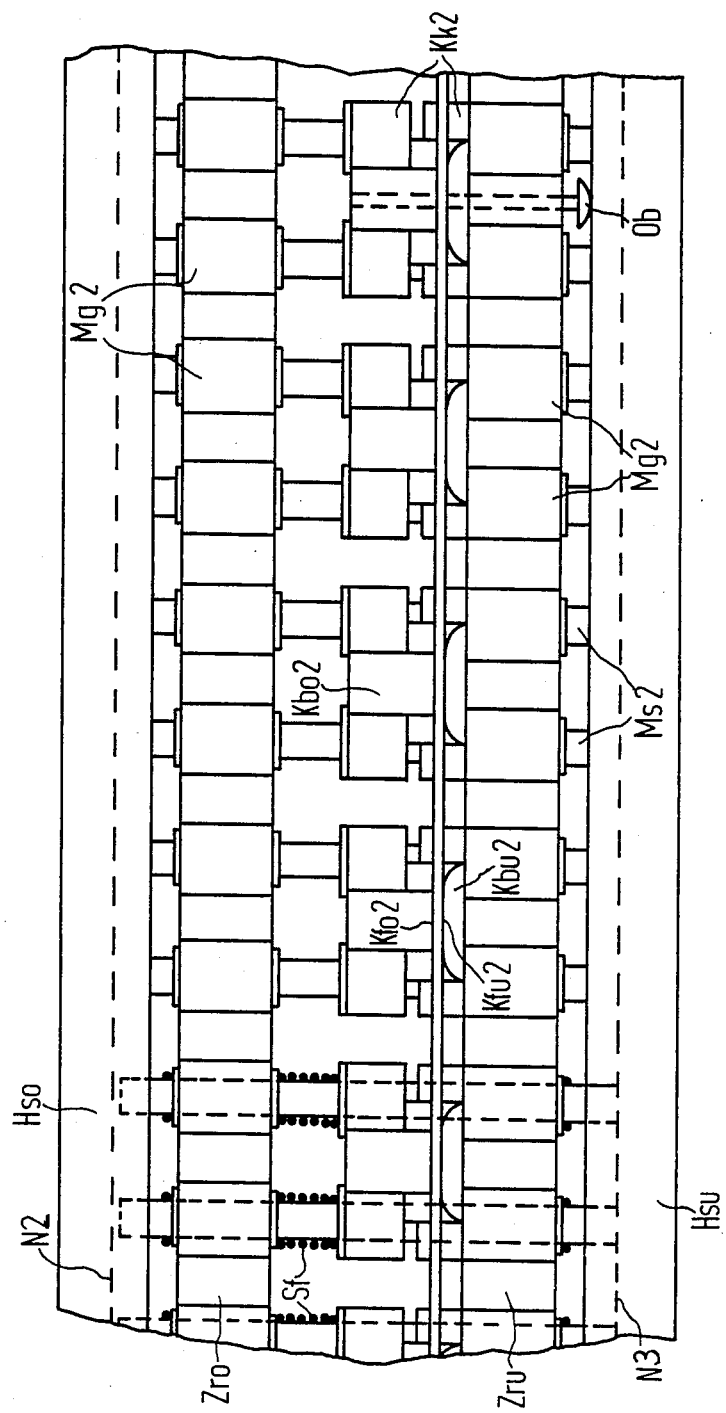
FIG. 7 is a side view of the embodiment of the contacting mechanism of FIGS. 5 and 6.

The second embodiment of the means, generally indicated at C1 in FIGS. 5-7, utilizes an upper toothed belt Zro and a lower toothed belt Zru, instead of a chain. Each of these belts Zro and Zru are provided with dog members Mg2 that are positioned uniformly along each of the belts. Vertically aligned dog pins Ms2 are held in these dog members Mg2. The upper end of the dog member pins Ms2 are guided in a U-shaped channel N2 of an upper retaining rail Hso and the lower ends of each of the pins Ms2 is guided in a channel N3 of a lower retaining rail Hsu. The upper and lower retaining rails Hsu and Hso are composed of a high molecular polyethylene and are rigidly connected to one another by spacer pins Dz.

Clamps Kk2 are composed of an upper jaw Kbo2 and a lower jaw Kbu2. The jaws Kbo2 and Kbu2 are slidably received on two dog pins Ms2 and extend between the two belts Zro and Zru. Pressure, which is required for closing the contact clamp Kk2 and for reliably contacting the printed circuit board Lp, is exerted by a closing spring Sf, which is arranged between a dog element and the upper jaw Kbo2 on each of the dog pins Ms2. As illustrated, the spring Sf is telescopically received on the pin Ms2.

A back side of the upper jaw Kbo2 has an angle-shaped current collector Sao, which slides along an upper brush Bo to receive the cathode current. The lower jaw Kbu2 has an angle-shaped current collector Sau, which slides on a lower brush Bu to receive the cathode current. The brushes Bo and Bu are composed of corrosion-resistant material such as, for example, a non-rusting steel, and are connected at their back surfaces to carriers Tro and Tru, respectively, which carriers are formed of copper or the like and are clamped between the retaining rails Hso and Hsu, together with an insulating intermediate layer Z. As a consequence of the described type of current transmission, current collectors Sao and Sau and brushes Bo and, respectively, Bu, as well as the closing spring Sf, the contact clamps Kk2 can be utilized for printed circuit boards Lp that have different thicknesses without a contact pressure being significantly changed.

As a result of equipping the contact clamps Kk2 with closing springs Sf, the contact clamp Kk2 must be opened in a constrained fashion in that the admission region for seizing the printed circuit board Lp and also opened in a discharge region for releasing the printed circuit board Lp. Link motions are provided for this purpose in the admission and discharge region of the printed circuit board and this link motion in indicated in FIG. 5 by a dot-dashed line Ks and in FIG. 7 by an opening bolt Ob. The head of the bolt Ob slides along the channel N3 on a corresponding cam surface of the lower retaining rail Hsu. Only in the admission and discharge regions does this cam surface raise ramp-like up to the level of the dot-dashed line Ks and, thus, press the opening bolt Ob in an upward direction. The opening bolt Ob, loosely connected through the lower clamp jaw Kbu2, thereby lifts the upper clamp jaw Kbo2 against the force of the two closing springs Sf and, thus, opens the contact clamp Kk2.

In the plan view of FIG. 6, the contact clamps Kk2 are cut away at different levels so that the shape of the lower contact surface Kfu may be seen at one location.

Moreover, the contact surface Kfo2 and Kfu2 can be cleaned during the return of the contact clamps Kk2 in a manner already set forth with regard to the clamps Kk1 of FIGS. 3 and 4.

Although various minor modifications may be suggested by those versed in the art, it should be understood that I wish to embody within the scope of the patent granted hereon all such modifications as reasonably and properly come within the scope of my contribution to the art.

I claim:

1. In an apparatus for electroplating of plate-shaped workpieces, which includes printed circuit boards, said apparatus comprising a cell containing electrolyte solution, means for transporting a workpiece in a horizontal plane through the cell, at least one anode being arranged in the electrolytic solution in the cell, and means for cathodic contacting the workpiece moving through the cell, the improvements comprising the means for cathodic contacting being formed as a tong-shaped contact clamp and including means for moving the clamp with the workpiece through the cell.

2. An apparatus according to claim 1, wherein the means for moving comprises a continuous moving member and a plurality of contact clamps spaced along said continuously moving member.

3. An apparatus according to claim 1, wherein the clamp and means for moving the clamp are arranged on each side of the workpiece passing through the cell.

4. An apparatus according to claim 1, wherein the means for moving the clamp includes an endless driven continuous member being arranged as a movable carrier for the clamps along one side of the through-put path.

5. In an apparatus according to claim 4, wherein the endless driven continuous member is in the form of a chain.

6. In an apparatus according to claim 4, wherein the endless driven continuous member comprises at least one toothed belt.

7. In an apparatus according to claim 6, wherein the endless driven continuous member includes an upper toothed belt and a lower toothed belt, each of said clamps including an upper jaw associated with the upper toothed belt and a lower jaw allocated to the lower toothed belt.

8. In an apparatus according to claim 4, wherein the endless driven continuous member and the contact clamps coact to form the means for transporting the workpiece through the cell.

9. In an apparatus according to claim 4, which includes means for mechanically cleaning contact surfaces of the contact clamp being arranged in a region of a return side of the endless driven continuous member.

10. In an apparatus according to claim 4, which includes means for chemically cleaning the contact surfaces of the contact clamps being arranged in a return side of the endless driven continuous member.

11. In an apparatus according to claim 1, wherein the means for cathodic contacting include a wiper contact slidably engaging a contact surface.

12. In an apparatus according to claim 11, wherein the clamp has an upper jaw and a lower jaw, each of the jaws having a wiper contact engaging a separate contact surface so that cathodic current is separately suppliable to the upper side and under side of the workpiece.

13. In an apparatus according to claim 11, wherein the means for cathodic contacting separately supplies both sides of the workpiece.

14. In an apparatus according to claim 11, wherein the contact surface engaged by the wiper contact is separated into length segments extending in the direction of movement of the workpiece through the cell.

15. In an apparatus according to claim 11, wherein the contact surface includes an upper live rail and a lower live rail, said clamp having an upper jaw with a wiper contact engaging the upper rail and a lower jaw having a wiper contact engaging the lower rail.

16. In an apparatus according to claim 15, wherein the upper and lower rails are positioned a fixed distance apart and the wiper contacts resiliently bias the upper and lower jaws together to form the clamping action on the workpiece.

17. In an apparatus according to claim 11, wherein the live surface comprises an upper brush extending in the direction of the movement of the workpiece through the cell and a lower brush extending parallel to the upper brush, and each clamp having an upper jaw with a wiper contact engaging the upper brush and a lower jaw having a wiper contact engaging the lower brush.

18. In an apparatus according to claim 17, wherein the wiper contact of the upper jaw is a current collector integrally formed on a back end of the upper jaw and the wiper contact of the lower jaw is a current collector integrally formed on the back end of the lower jaw.

19. In an apparatus according to claim 17, wherein the clamp includes a closing spring for holding the upper jaw against the lower jaw and includes a link element activated at the admission and discharge regions of the workpiece for opening the jaws.

20. In an apparatus according to claim 19, wherein the link arrangement comprises opening bolt carried by each clamp, said opening bolt riding on a cam track and forcing open the jaws against the force of the closing spring.

21. In an electroplating apparatus according to claim 1, which includes a side wall of the cell extending in the parallel direction of movement of the workpiece having a slot with seals, the workpiece having a lateral portion extending through said slot and seals and the means for cathodic contacting being arranged outside of the cell and engaging the lateral portion of the workpiece extending through the seal and slot.

* * * * *